United States Patent
Hsieh et al.

(10) Patent No.: US 11,929,407 B2
(45) Date of Patent: Mar. 12, 2024

(54) METHOD OF FABRICATING HIGH ELECTRON MOBILITY TRANSISTOR

(71) Applicant: Vanguard International Semiconductor Corporation, Hsinchu (TW)

(72) Inventors: Ting-En Hsieh, New Taipei (TW); Yu-Chieh Chou, New Taipei (TW); Yung-Fong Lin, Taoyuan (TW)

(73) Assignee: Vanguard International Semiconductor Corporation, Hsinchu (TW)

( * ) Notice: Subject to any disclaimer, the term of this patent is extended or adjusted under 35 U.S.C. 154(b) by 145 days.

(21) Appl. No.: 17/827,809

(22) Filed: May 30, 2022

(65) Prior Publication Data

US 2022/0293747 A1  Sep. 15, 2022

Related U.S. Application Data

(62) Division of application No. 16/861,191, filed on Apr. 28, 2020, now Pat. No. 11,380,767.

(51) Int. Cl.
*H01L 29/66* (2006.01)
*H01L 21/02* (2006.01)
(Continued)

(52) U.S. Cl.
CPC ........ *H01L 29/408* (2013.01); *H01L 21/0214* (2013.01); *H01L 21/02164* (2013.01);
(Continued)

(58) Field of Classification Search
CPC ................................................ H01L 29/66462
See application file for complete search history.

(56) References Cited

U.S. PATENT DOCUMENTS 9,673,311 B1   6/2017  Moens
2011/0272742 A1*  11/2011  Akiyama .......... H01L 29/41725
                                                257/E21.403
(Continued)

FOREIGN PATENT DOCUMENTS

TW   I375326      10/2012
TW   I505462 B    10/2015
(Continued)

OTHER PUBLICATIONS

Alex Lidow et al., GaN Transistors for Efficient Power Conversion, Second Edition, GaN Technology Overview, John Wiley & Sons, Ltd., 2015, https://www.wiley.com/go/gan_transistors, pp. 1 & 6 & 12-13.

(Continued)

*Primary Examiner* — Grant S Withers
(74) *Attorney, Agent, or Firm* — Winston Hsu

(57) ABSTRACT

A method of fabricating a HEMT includes the following steps. A substrate having a group III-V channel layer, a group III-V barrier layer, a group III-V gate layer, and a gate etch stop layer disposed thereon is provided. A passivation layer is formed to cover the group III-V barrier layer and the gate etch stop layer. A gate contact hole and at least one source/drain contact hole are formed in the passivation layer, where the gate contact hole exposes the gate etch stop layer, and the at least one source/drain contact hole exposes the group III-V channel layer. In addition, a conductive layer is conformally disposed on a top surface of the passivation layer and in the gate contact hole and the at least one source/drain contact hole.

11 Claims, 9 Drawing Sheets

(51) Int. Cl.
| | |
|---|---|
| *H01L 21/285* | (2006.01) |
| *H01L 23/29* | (2006.01) |
| *H01L 23/31* | (2006.01) |
| *H01L 29/20* | (2006.01) |
| *H01L 29/205* | (2006.01) |
| *H01L 29/40* | (2006.01) |
| *H01L 29/47* | (2006.01) |
| *H01L 29/778* | (2006.01) |

(52) U.S. Cl.
CPC .... *H01L 21/0217* (2013.01); *H01L 21/02178* (2013.01); *H01L 21/28581* (2013.01); *H01L 23/291* (2013.01); *H01L 23/3171* (2013.01); *H01L 29/2003* (2013.01); *H01L 29/205* (2013.01); *H01L 29/475* (2013.01); *H01L 29/66462* (2013.01); *H01L 29/7786* (2013.01); *H01L 29/7787* (2013.01)

(56) References Cited

U.S. PATENT DOCUMENTS

| | | |
|---|---|---|
| 2015/0357453 A1 | 12/2015 | Yu |
| 2017/0062581 A1 | 3/2017 | You |
| 2017/0110548 A1 | 4/2017 | Kawaguchi |
| 2017/0170306 A1* | 6/2017 | Nakayama ........ H01L 29/66431 |
| 2020/0357905 A1* | 11/2020 | Lu .......................... H01L 29/205 |
| 2021/0184010 A1 | 6/2021 | Chong |

FOREIGN PATENT DOCUMENTS

| | | |
|---|---|---|
| TW | I509794 B | 11/2015 |
| TW | 201842678 A | 12/2018 |

OTHER PUBLICATIONS

Matteo Meneghini et al., Technology and Reliability of Normally-Off GaN HEMTs with p-Type Gate, Energies 2017, 10, 153, Alberto Castellazzi and Andrea Irace, 2017, pp. 1 & 5. ,2017.

L. Efthymiou et al., On the physical operation and optimization of the p-GaN gate in normally-off GaN HEMT devices, Appl. Phys. Lett. 110, 123502 (2017), pp. 123502-1~5, https://doi.org/10.1063/1.4978690, AIP Publishing, USA, Mar. 21, 2017.

Tian-Li Wu et al., "Forward Bias Gate Breakdown Mechanism in Enhancement-Mode p-GaN Gate AlGaN/GaN High-Electron Mobility Transistors", IEEE Electron Device Letters, vol. 36, No. 10, Oct. 2015, pp. 1001-1003.

* cited by examiner

METHOD OF FABRICATING HIGH ELECTRON MOBILITY TRANSISTOR

CROSS REFERENCE TO RELATED APPLICATIONS

This application is a division of U.S. application Ser. No. 16/861,191, filed on Apr. 28, 2020. The content of the application is incorporated herein by reference.

BACKGROUND OF THE INVENTION

1. Field of the Invention

The present disclosure relates generally to the field of transistors, and more particularly to high electron mobility transistors and methods of fabricating the same.

2. Description of the Prior Art

In semiconductor technology, group III-V semiconductor compounds may be used to construct various integrated circuit (IC) devices, such as high power field-effect transistors (FETs), high frequency transistors, or high electron mobility transistors (HEMTs). A HEMT is a field effect transistor having a two dimensional electron gas (2-DEG) layer close to a junction between two materials with different band gaps (i.e., a heterojunction). The 2-DEG layer is used as the transistor channel instead of a doped region, as is generally the case for metal oxide semiconductor field effect transistors (MOSFETs). Compared with MOSFETs, HEMTs have a number of attractive properties such as high electron mobility and the ability to transmit signals at high frequencies.

However, conventional method of fabricating HEMT often require separate photolithography, etching, and metal deposition processes in order to separately define a gate contact hole, source/drain contact holes, a gate electrode, and source/drain electrodes in the HEMT, which undoubtedly increases the complexity and cost of the overall fabrication process.

SUMMARY OF THE INVENTION

In view of this, it is necessary to provide an improved high electron mobility transistor without the drawbacks of conventional high electron mobility transistors.

According to one embodiment of the present disclosure, a HEMT is disclosed and includes a group III-V channel layer, a passivation layer, a group III-V barrier layer, a gate structure, and a source/drain electrode. The passivation layer is disposed on the group III-V channel layer and includes a gate contact hole and a source/drain contact hole, and the group III-V barrier layer is disposed between the group III-V channel layer and the passivation layer. The gate structure includes group III-V gate layer, a gate etch stop layer, and a gate electrode which are sequentially stacked. The gate electrode is disposed in the gate contact hole and conformally covers a portion of the top surface of the passivation layer. The source/drain electrode is disposed in the source/drain contact hole and conformally covers another portion of the top surface of the passivation layer.

According to another embodiment of the present disclosure, a method of fabricating a HEMT may include the following steps. A substrate having a group III-V channel layer, a group III-V barrier layer, a group III-V gate layer, and a gate etch stop layer disposed thereon is provided; a passivation layer is formed to cover the group III-V barrier layer and the gate etch stop layer; a gate contact hole and at least one source/drain contact hole are formed in the passivation layer, where the gate contact hole exposes the gate etch stop layer, and the at least one source/drain contact hole exposes the group III-V channel layer; and a conductive layer is conformally disposed on a top surface of the passivation layer and in the gate contact hole and the at least one source/drain contact hole.

According to the embodiments of the present disclosure, a gate contact hole and source/drain contact holes may be formed concurrently in a passivation layer by the same photolithography and etching processes. Besides, by properly adjusting the parameters of the etching process, not only may the bottom of the gate contact hole not penetrate the underlying gate etch stop layer, but the source/drain contact holes may not penetrate the underlying group III-V channel layer. Subsequently, a gate electrode and the source/drain electrodes may be fabricated concurrently through the same deposition, photolithography, and etching processes. Therefore, the embodiments of the present disclosure could effectively simplify the complexity and cost of the fabrication process.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
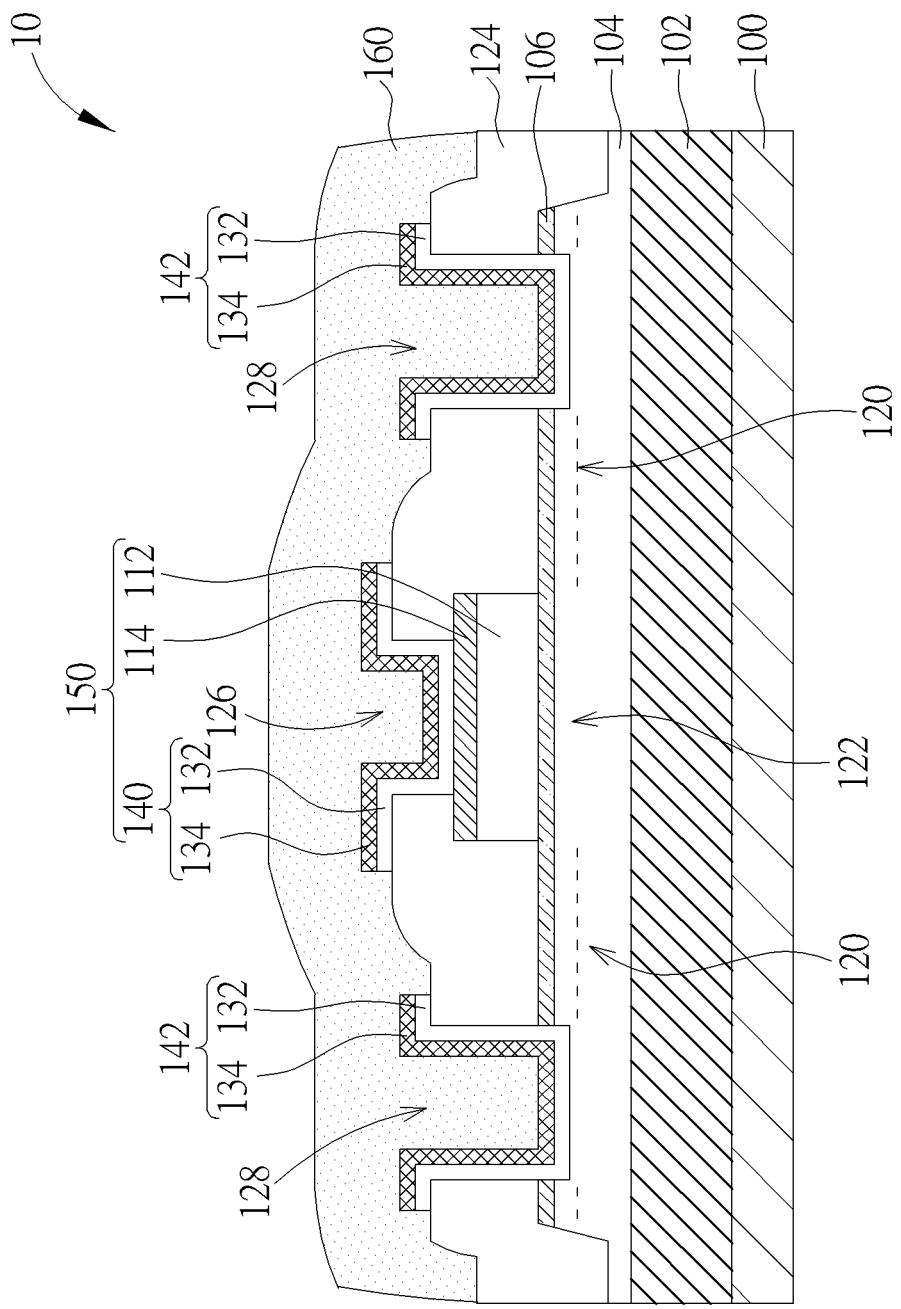
FIG. 1 is a schematic cross-sectional diagram of a high electron mobility transistor (HEMT) according to one embodiment of the disclosure.

The following disclosure provides many different embodiments, or examples, for implementing different features of the disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "over," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. For example, if the device in the figures is turned over, elements described as "below" and/or "beneath" other elements or features would then be oriented "above" and/or "over" the other elements or features. The apparatus may be otherwise oriented (rotated 90 degrees or at other orientations) and the spatially relative descriptors used herein may likewise be interpreted accordingly.

It is understood that, although the terms first, second, third, etc. may be used herein to describe various elements, components, regions, layers and/or sections, these elements, components, regions, layers and/or sections should not be limited by these terms. These terms may be only used to distinguish one element, component, region, layer and/or section from another region, layer and/or section. Terms such as "first," "second," and other numerical terms when used herein do not imply a sequence or order unless clearly indicated by the context. Thus, a first element, component, region, layer and/or section discussed below could be termed a second element, component, region, layer and/or section without departing from the teachings of the embodiments.

As disclosed herein, the term "about" or "substantial" generally means within 20%, 10%, 5%, 3%, 2%, 1%, or 0.5% of a given value or range. Unless otherwise expressly specified, all of the numerical ranges, amounts, values and percentages disclosed herein should be understood as modified in all instances by the term "about" or "substantial". Accordingly, unless indicated to the contrary, the numerical parameters set forth in the present disclosure and attached claims are approximations that can vary as desired.

In the present disclosure, a "group III-V semiconductor" refers to a compound semiconductor that includes at least one group III element and at least one group V element, where group III element may be boron (B), aluminum (Al), gallium (Ga) or indium (In), and group V element may be nitrogen (N), phosphorous (P), arsenic (As), or antimony (Sb). Furthermore, the group III-V semiconductor may refer to, but not limited to, gallium nitride (GaN), indium phosphide (InP), aluminum arsenide (AlAs), gallium arsenide (GaAs), aluminum gallium nitride (AlGaN), indium aluminum gallium nitride (InAlGaN), indium gallium nitride (InGaN), aluminum nitride (AlN), gallium indium phosphide (GaInP), AlGaAs, InAlAs, InGaAs, or the like, or the combination thereof. Besides, based on different requirements, group III-V semiconductor may contain dopants to become semiconductor with specific conductivity type, such as N-type or P-type.

Although the disclosure is described with respect to specific embodiments, the principles of the invention, as defined by the claims appended herein, can obviously be applied beyond the specifically described embodiments of the invention described herein. Moreover, in the description of the present disclosure, certain details have been left out in order to not obscure the inventive aspects of the disclosure. The details left out are within the knowledge of a person of ordinary skill in the art.

The present disclosure is directed to a group III-V high electron mobility transistor (HEMT) and method for fabricating the same. III-V HEMTs on silicon substrates are used as power switching transistors for voltage converter applications. Compared to silicon power transistors, III-V HEMTs feature low on-state resistances and low switching losses due to wide bandgap properties.

FIG. 1 is a schematic cross-sectional diagram of a high electron mobility transistor (HEMT) according to one embodiment of the disclosure. Referring to FIG. 1, a high electron mobility transistor (HEMT) 10, such as an enhancement mode high electron mobility transistor, is disposed on a substrate 100. A group III-V channel layer 104, a group III-V barrier layer 106, a group III-V gate layer 112, a gate etch stop layer 114, and a passivation layer 124 may be stacked on the substrate in sequence. The group III-V barrier layer 106 may be disposed on the group III-V channel layer 104, and a gate contact hole 126 and at least one source/drain contact hole (e.g., two separately disposed source/drain contact holes 128) may be disposed in the passivation layer 124. The gate electrode 140 may be conformally disposed in the gate contact hole 126 and indirect contact with the gate etch stop layer 114 exposed from the gate contact hole 126, and the gate electrode 140 may conformally cover a portion of the top surface of the passivation layer 124. In addition, the gate etch stop layer 114, the passivation layer 124, and the gate electrode 140 may constitute a gate structure 150. The source/drain electrodes 142 may be conformally disposed in the source/drain contact holes 128 respectively and in direct contact with the group III-V barrier layer 106 or the group III-V channel layer 104 exposed from the bottom of the source/drain contact holes 128. Besides, the source/drain electrodes 142 may conformally cover another portion of the top surface of the passivation layer 124.

The substrate 100 may be a bulk silicon substrate, a silicon carbide (SiC) substrate, a sapphire substrate, a silicon on insulator (SOI) substrate or a germanium on insulator (GOI) substrate, but not limited thereto. According to one embodiment of the present disclosure, the group III-V channel layer 104 may include one or more layers of group III-V semiconductor composed of GaN, AlGaN, InGaN, or InAlGaN, but not limited thereto. In addition, the group III-V channel layer 104 may also be one or more layers of doped group III-V semiconductor, such as p-type III-V semiconductor. For the p-type group III-V semiconductor, the dopants of which may be C, Fe, Mg or Zn, but is not limited thereto. The group III-V barrier layer 106 may include one or more layers of group III-V semiconductor with the composition different from that of the group III-V semiconductor of the group III-V channel layer 104. For example, the group III-V barrier layer 106 may include AlN, $Al_yGa_{(1-y)}N$ (0<y<1), or a combination thereof. In accordance with one embodiment, the group III-V channel layer 104 may be an undoped GaN layer, and the group III-V barrier layer 106 may be an intrinsic n-type AlGaN layer. Since there is a bandgap discontinuity between the group III-V channel layer 104 and the group III-V barrier layer 106, by stacking the group III-V channel layer 104 and the group III-V barrier layer 106 on each other (and vice versa), a thin layer of two-dimensional electron gas (2-DEG), may be accumulated in a region, i.e., 2-DEG region 120, near the heterojunction between the group III-V channel layer 104 and the group III-V barrier layer 106 due to the piezoelectric effect. In contrast, 2-DEG may not be generated in the region covered by the group III-V gate layer 112, and thus this region may be regarded as a 2-DEG cutoff region 122.

In addition, the group III-V gate layer 112 disposed on the group III-V barrier layer 106 may include one or more layers of group III-V semiconductor composed of GaN, AlGaN, InGaN, or InAlGaN, but not limited thereto. In addition, the group III-V gate layer 112 may also include one or more layers of doped group III-V semiconductor, such as p-type III-V semiconductor. For the p-type group III-V semiconductor, the dopants of which may be C, Fe, Mg or Zn, but not limited thereto. The group III-V gate layer 112 may be p-type GaN in accordance according to one embodiment of the present disclosure.

According to one embodiment of the present disclosure, the above gate etch stop layer 114 may be disposed on the group III-V gate layer 112. The gate etch stop layer 114 and the passivation layer 124 may have different etch rates and a Schottky contact may be formed between the gate etch stop layer 114 and the group III-V gate layer 112. According to one embodiment of the present disclosure, the composition of the gate etch stop layer 114 may be metal nitride containing refractory metal which is selected from the group consisting of titanium, zirconium, hafnium, vanadium, niobium, tantalum, chromium, molybdenum, tungsten, manganese, rhenium, ruthenium, osmium, rhodium and iridium. According to one embodiment of the present disclosure, the gate etch stop layer 114 may be titanium nitride.

According to one embodiment of the present disclosure, the passivation layer 124 may be used to eliminate or reduce the surface defects existing on both the sidewalls of the group III-V channel layer 104 and the top surface of the group III-V barrier layer 106, thereby enhancing the electron mobility in the 2-DEG region 120. According to one embodiment of the present disclosure, the passivation layer 124 may be silicon nitride (SiN), silicon oxynitride (SiON), aluminum nitride (AlN), aluminum oxide ($Al_2O_3$), or silicon oxide ($SiO_2$), but not limited thereto.

According to one embodiment of the present disclosure, the contact between the gate electrode 140 and the group III-V gate layer 112 is Schottky contact, and the contact between each source/drain electrode 142 and the group III-V channel layer 104 is ohmic contact. In addition, each of the gate electrode 140 and the source/drain electrode 142 may be a single-layered or a composite conductive layer, and the composite conductive layer, for example, may include a first conductive layer 132 and a second conductive layer 134 stacked from bottom to top. The first conductive layer 132 may be used to increase the adhesion between the second conductive layer 134 and other layers, and the second conductive layer 134 may be a conductive layer with lower resistance. According to one embodiment of the present disclosure, the first conductive layer 132 and the second conductive layer 134 may be titanium and aluminum, respectively, but not limited thereto. According to some embodiments of the present disclosure, each of the gate electrode 140 and the source/drain electrodes 142 may be a composite conductive layer composed of titanium/aluminum/titanium/gold stacked from bottom to top.

According to one embodiment of the present disclosure, an additional buffer layer 102 may be disposed between the substrate 100 and the group III-V channel layer 104. The purpose of the buffer layer 102 may be to reduce stress or lattice mismatch between the substrate 100 and the group III-V channel layer 104. In addition, the high electron mobility transistor 10 may further include an interlayer dielectric 160 covering the passivation layer 124, the gate electrode 140, and the source/drain electrodes 142, and the interlayer dielectric 160 may be SiN, AlN, $Al_2O_3$, SiON or $SiO_2$, but not limited thereto.

In order to enable one of ordinary skill in the art to implement the present disclosure, a method of fabricating an HEMT is further described below.

Figure 2:
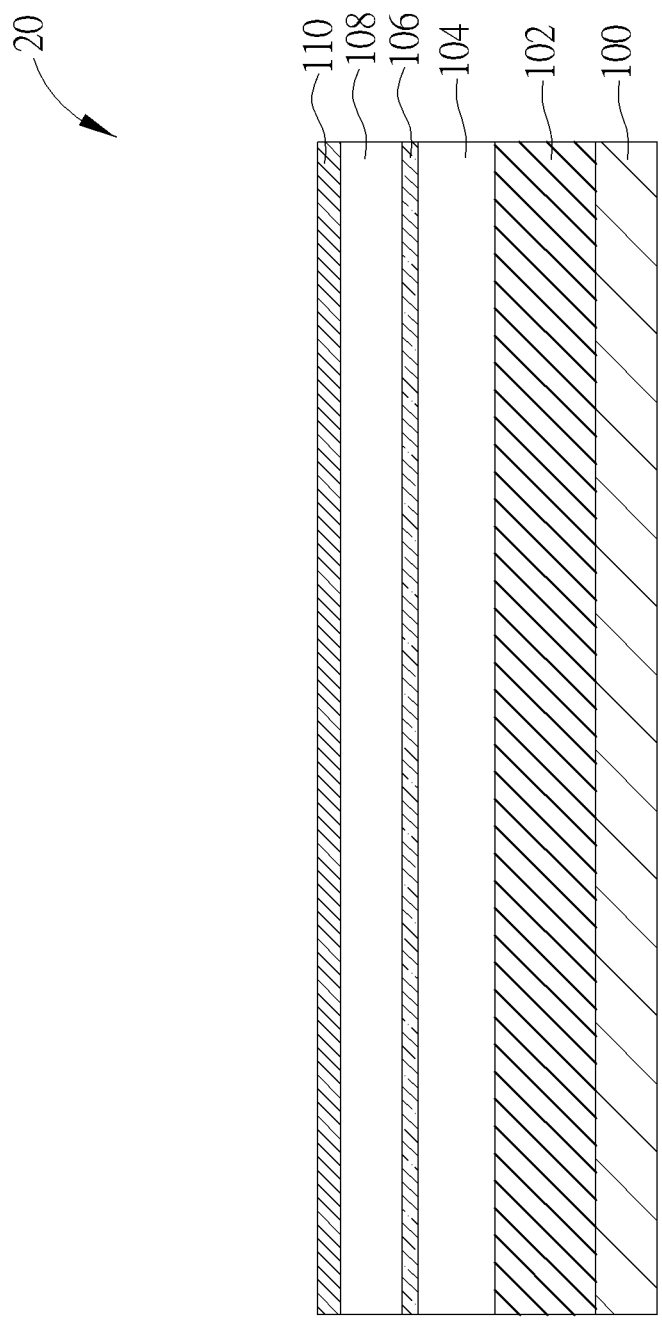
FIG. 2 is a schematic cross-sectional diagram of a HEMT having a group III-V channel layer, a group III-V barrier layer, a group III-V semiconductor layer, and an etch stop layer disposed on a substrate according to one embodiment of the disclosure.

FIG. 2 is a schematic cross-sectional diagram of a HEMT having a group III-V channel layer, a group III-V barrier layer, a group III-V semiconductor layer, and an etch stop layer disposed on a substrate according to one embodiment of the disclosure. Referring to FIG. 2, at a stage of fabricating a HEMT 20, stacked layers containing a buffer layer 102, a III-V channel layer 104, a III-V barrier layer 106, a III-V semiconductor layer 108, and an etch stop layer 110 from bottom to top may be disposed on a substrate 100, and the stacked layers may be formed through any suitable growth processes, such as molecular-beam epitaxy (MBE), metal-organic chemical vapor deposition (MOCVD), hydride vapor phase epitaxy (HYPE), atomic layer deposition (ALD) or other suitable growth processes. The buffer layer 102 may include a plurality of sub-semiconductor layers (i.e., multiple layers) and the overall resistance of the buffer layer 102 may be higher than the resistance of other layers on the substrate 100. Specifically, the ratio of some elements, such as metal element, of the buffer layer 102 may be changed gradually along a direction from the substrate 100 to the group III-V channel layer 104. For example, for a case where the substrate 100 and the group III-V channel layer 104 are a silicon substrate and a GaN layer, respectively, the buffer layer 102 may be graded aluminum gallium nitride ($Al_xGa_{(1-x)}N$) where there is a continuous or stepwise decrease in the x ratio from 0.9 to 0.15 along the direction from the substrate 100 to the group III-V channel layer 104.

Figure 3:
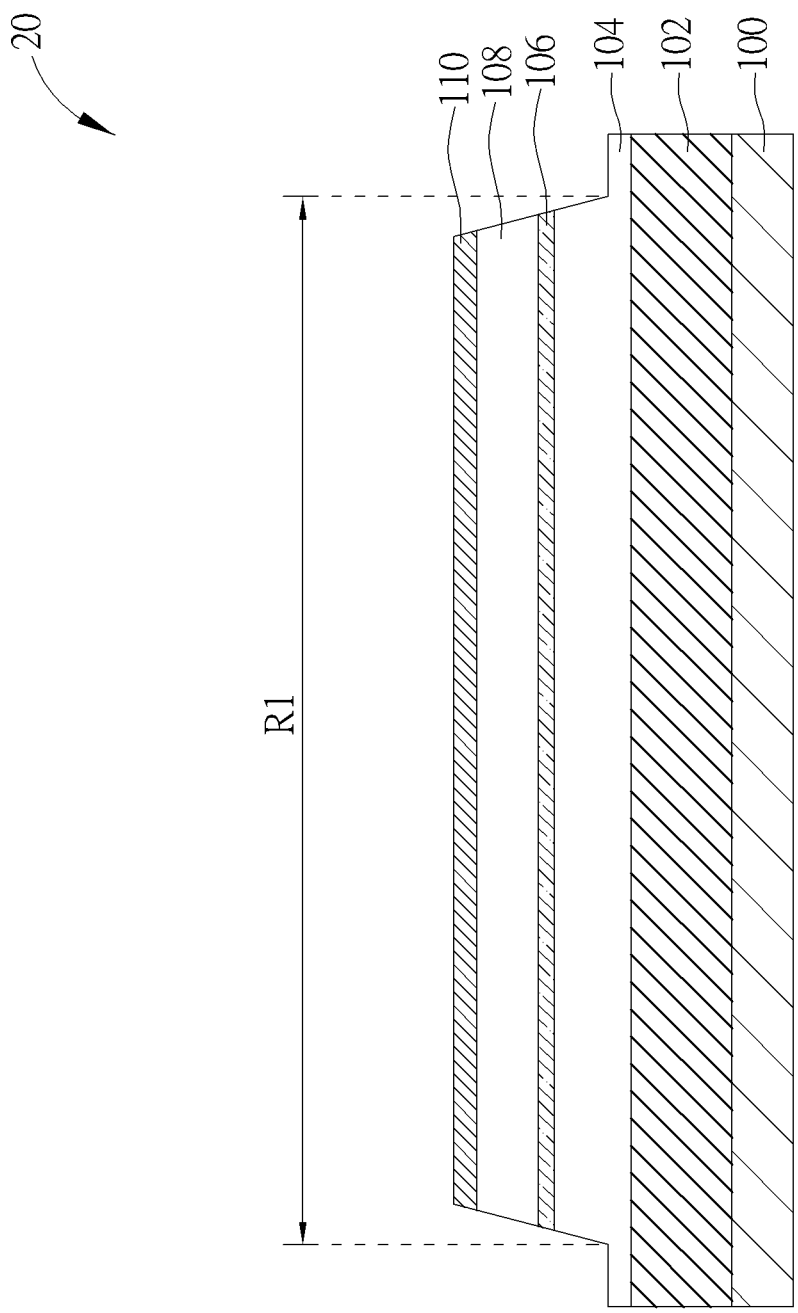
FIG. 3 is a schematic cross-sectional diagram of a HEMT having an active region on a substrate according to one embodiment of the disclosure.

FIG. 3 is a schematic cross-sectional diagram of a HEMT having an active region on a substrate according to one embodiment of the disclosure. Referring to FIG. 3, one or more photolithography and etching processes may be performed to sequentially remove portions of the etch stop layer 110, the group III-V semiconductor layer 108, the group III-V barrier layer 106, and III-Group V channel layer 104 to thereby form a mesa R1, which is a protruding structure, on the substrate 100. In the subsequent process, the periphery of the mesa R1 may be surrounded by an insulating structure to avoid unnecessary electrical connection between the components in the mesa R1 and adjacent other semiconductor devices.

Figure 4:
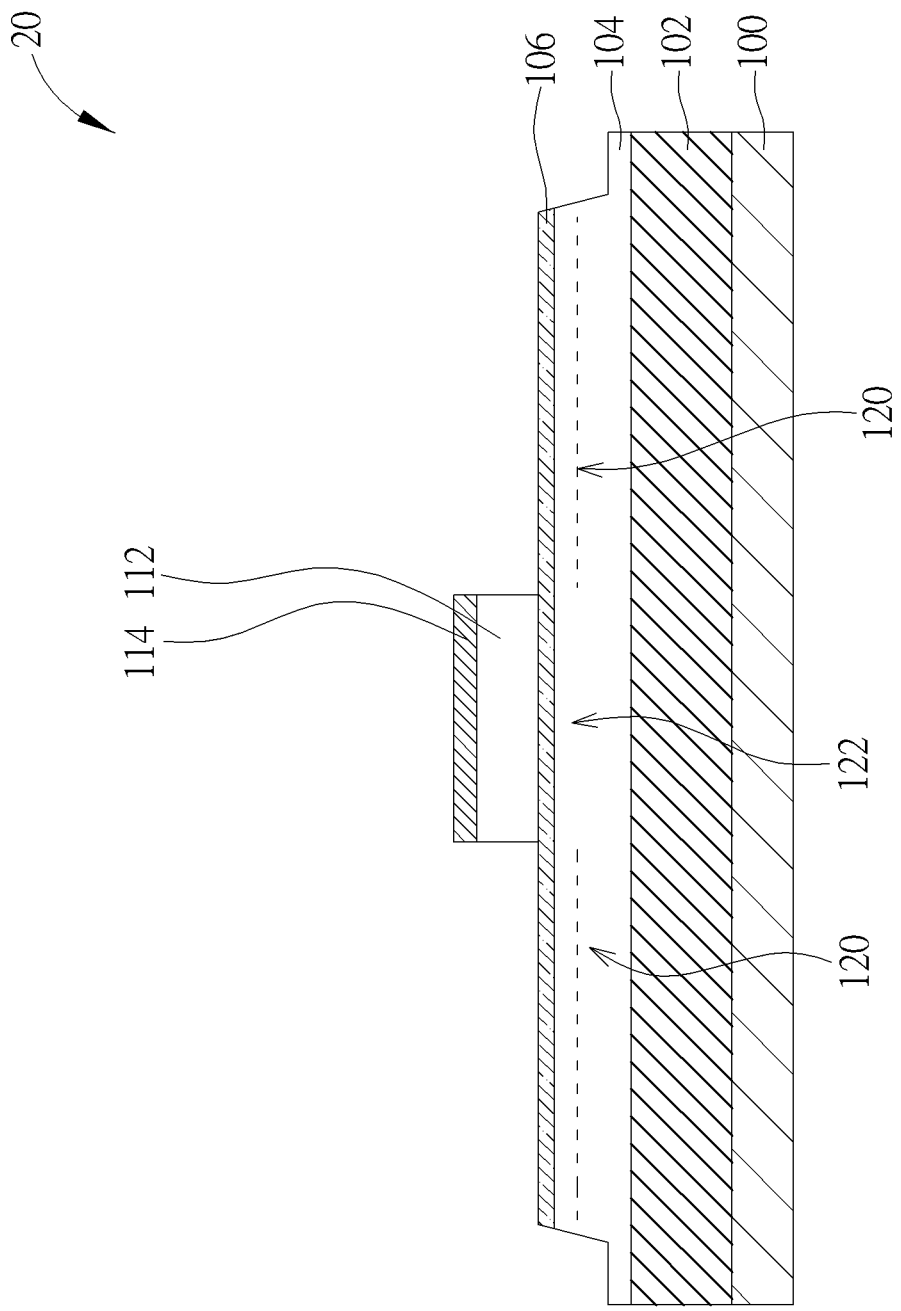
FIG. 4 is a schematic cross-sectional diagram of a HEMT having a group III-V gate layer and a gate etch stop layer disposed on a substrate according to one embodiment of the disclosure.

FIG. 4 is a schematic cross-sectional diagram of a HEMT having a group III-V gate layer and a gate etch stop layer disposed on a substrate according to one embodiment of the disclosure. The etch stop layer 110 and the group III-V semiconductor layer 108 on the substrate 100 may be patterned simultaneously or separately to form the gate etch stop layer 114 and the group III-V gate layer 112 as shown in FIG. 4 and to expose a portion of the top surface of the group III-V barrier layer 106. The gate etch stop layer 114 and the group III-V gate layer 112 may be of the same width, so that the gate etch stop layer 114 and the group III-V gate layer 112 are substantially coextensive. In addition, after the gate etch stop layer 114 and the group III-V gate layer 112 are formed, a thin layer of 2-DEG may be generated in a region (referred to as 2-DEG region 120) not covered by the group III-V gate layer 112 due to the piezoelectric effect. In contrast, 2-DEG may not be generated in the region covered by the group III-V gate layer 112, and thus this region may be regarded as a 2-DEG cutoff region 122.

Figure 5:
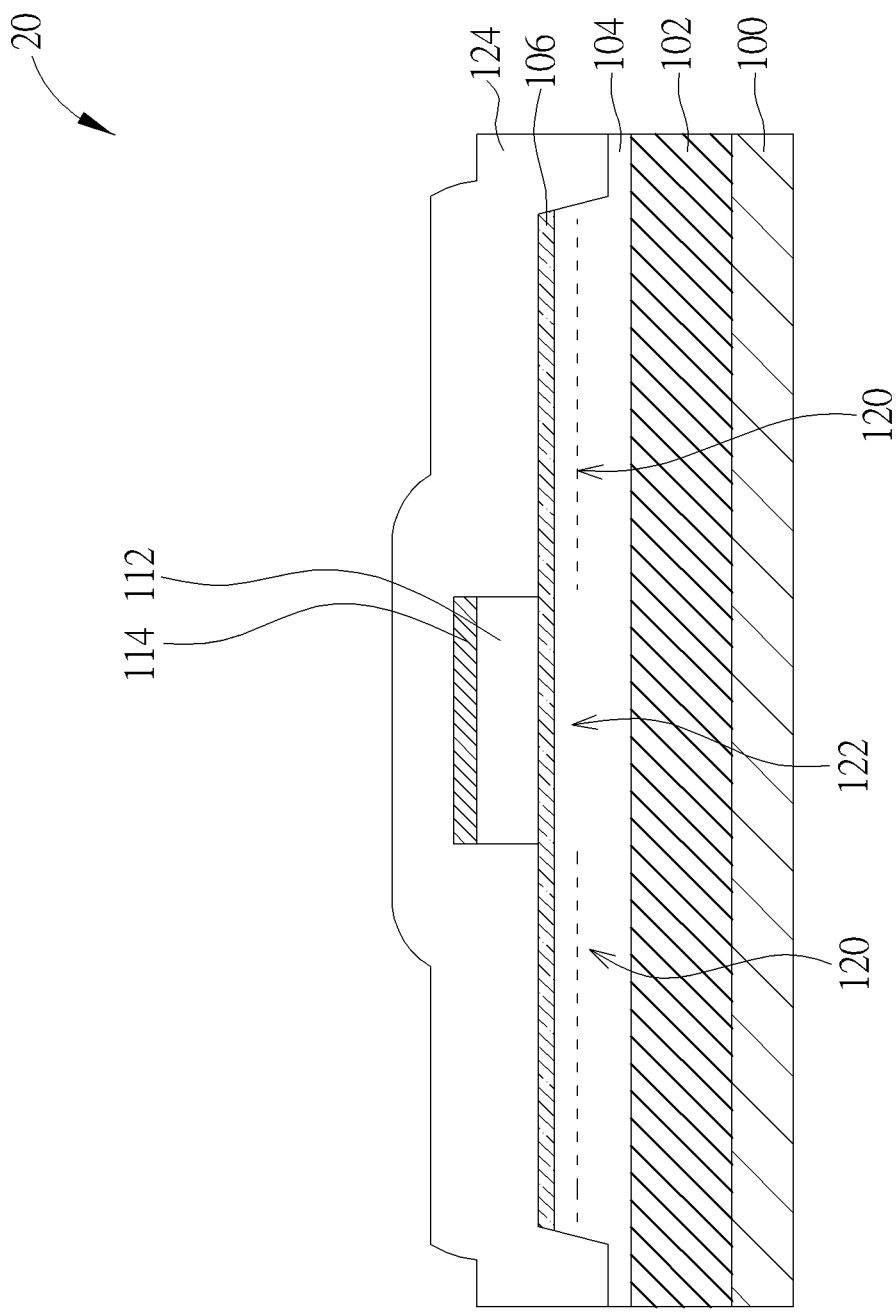
FIG. 5 is a schematic cross-sectional diagram of a HEMT where a group III-V gate layer and a gate etch stop layer are covered by a passivation layer according to one embodiment of the disclosure.

FIG. 5 is a schematic cross-sectional diagram of a HEMT where a group III-V gate layer and a gate etch stop layer are covered by a passivation layer according to one embodiment of the disclosure. Referring to FIG. 5, a passivation layer 124, made of for example SiN, AlN, $Al_2O_3$ or $SiO_2$, but not limited thereto, may be deposited by a proper deposition process. The passivation layer 124 may cover the gate etch stop layer 114, the group III-V gate layer 112, the group III-V channel layer 104, and the group III-V barrier layer 106 completely.

Figure 6:
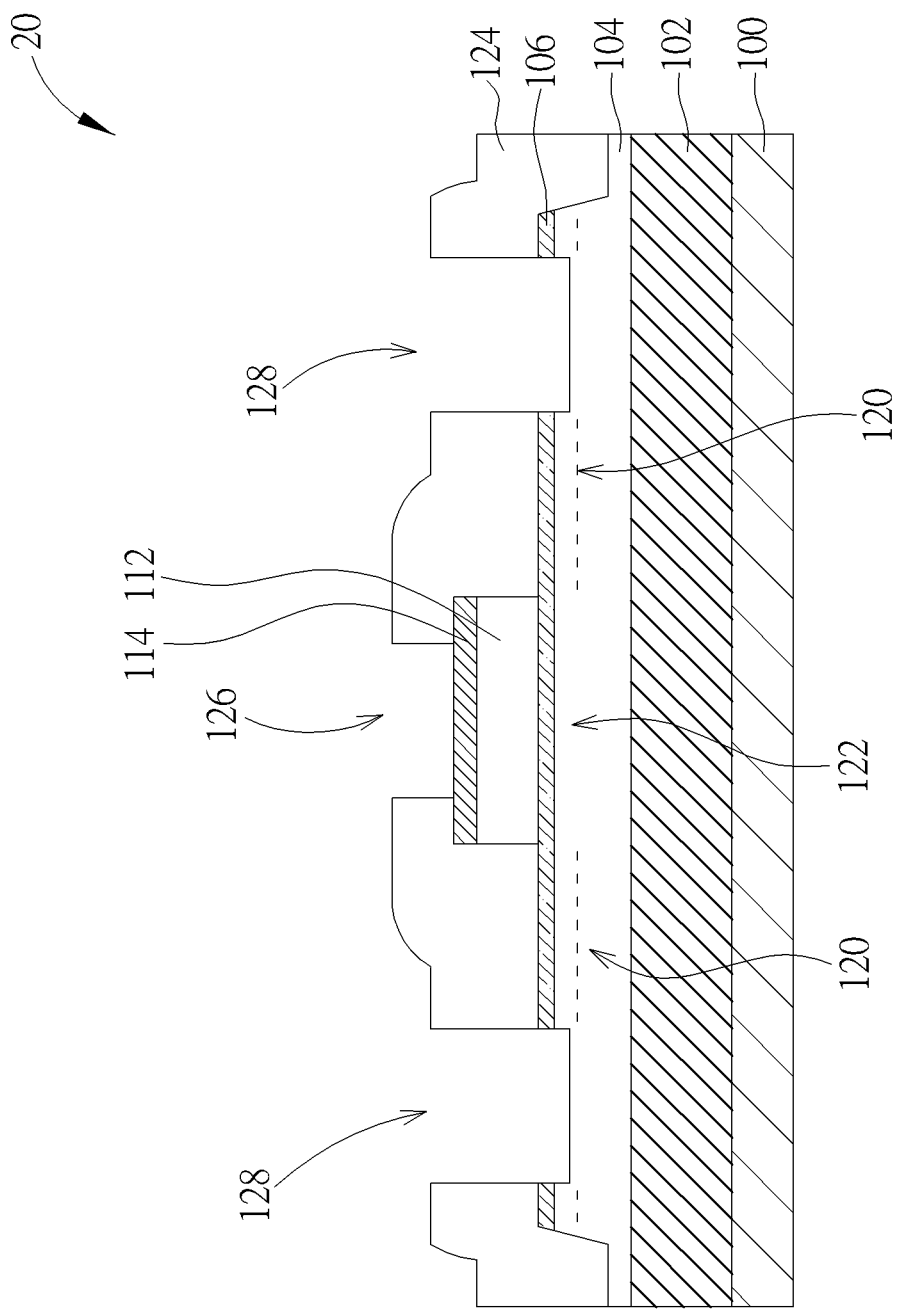
FIG. 6 is a schematic cross-sectional diagram of a HEMT after a gate contact hole and a source/drain contact hole are formed in a passivation layer according to one embodiment of the disclosure.

FIG. 6 is a schematic cross-sectional diagram of a HEMT after a gate contact hole and a source/drain contact hole are formed in a passivation layer according to one embodiment of the disclosure. Referring to FIG. 6, by conducting photolithography and etching processes, gate contact hole 126 may be formed above the group III-V gate layer 112, and at least one source/drain contact hole, such as two separate source/drain contact holes 128, is formed at each side of the III-V gate layer 112. In the etching process of forming contact holes, appropriate etchants and parameters may be selected so that there are a selective etching of the passivation layer 124 over the gate etch stop layer 114 and a selective etching of the passivation layer 124 over the group III-V channel layer 104, which means that an etch selectivity for each material pair may exceed a preset value, for example, of 5 to 300. Therefore, when the etching process is completed, the bottom surface of the gate contact hole 126 may be located on the top surface of the gate etch stop layer 114, thus exposing the top surface of the gate etch stop layer 114; and the bottom surfaces of the source/drain contact holes 128 may be located on the top surface of the group III-V channel layer 104 or extend into the group III-V channel layer 104, thus exposing the group III-V channel layer 104. In addition, since the bottom surfaces of the source/drain contact holes 128 may be located on the top surface of the group III-V channel layer 104 or extend into the group III-V channel layer 104, the corresponding 2-DEG cutoff region 122 may be formed under each source/drain contact hole 128.

Figure 7:
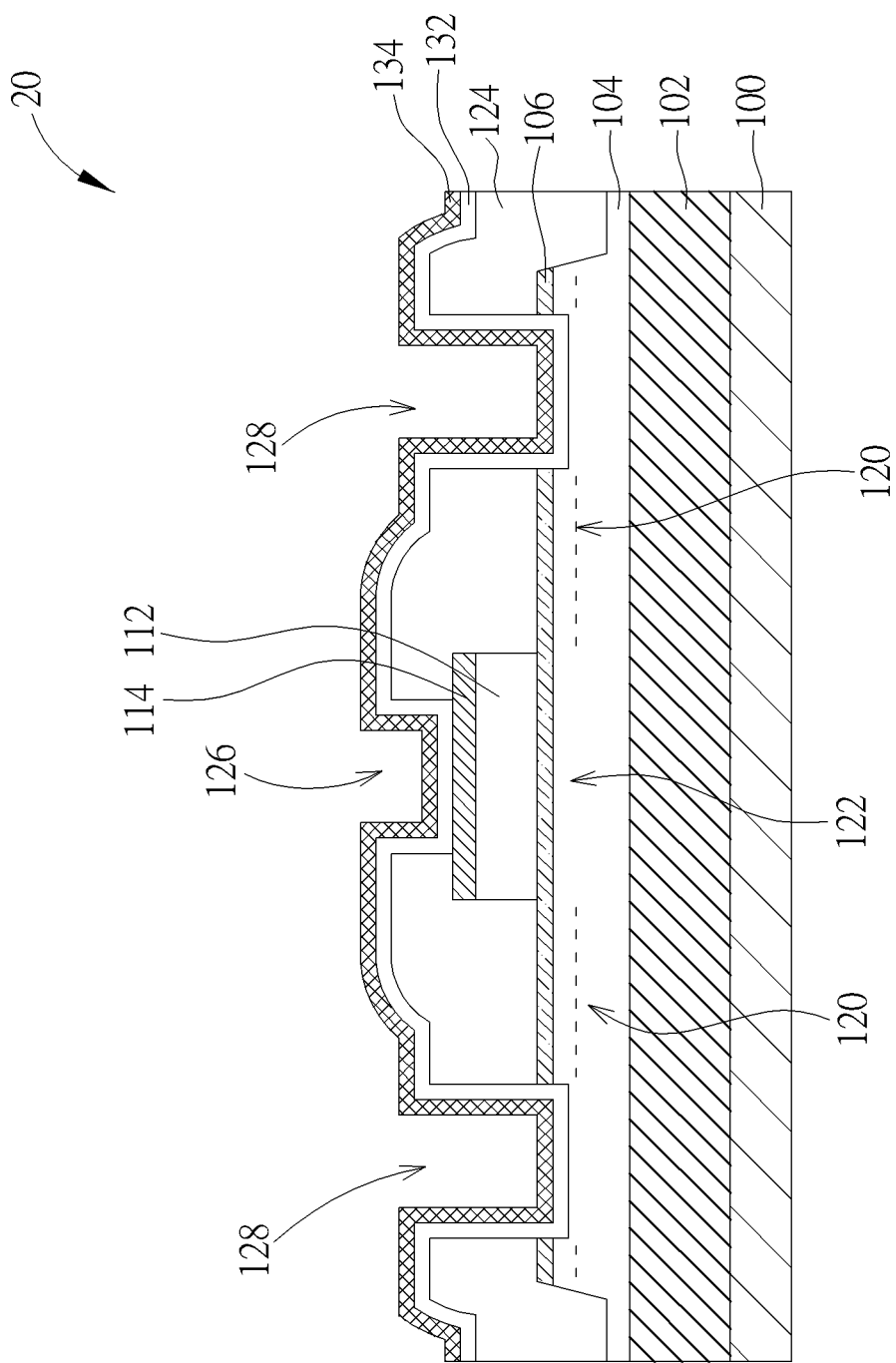
FIG. 7 is a schematic cross-sectional diagram of a HEMT after a blanket deposition of a conductive layer according to one embodiment of the disclosure.

FIG. 7 is a schematic cross-sectional diagram of a HEMT after a blanket deposition of a conductive layer according to one embodiment of the disclosure. A suitable deposition process may be used to deposit a conductive layer on the top surface of the passivation layer 124, in the gate contact hole 126, and in the source/drain contact holes 128, e.g., a composite conductive layer made of a first conductive layer 132 and a second conductive layer 134. According to one embodiment of the present disclosure, the second conductive layer 134 may fill up the gate contact hole 126 completely when the gate contact hole 126 has a small opening area.

Figure 8:
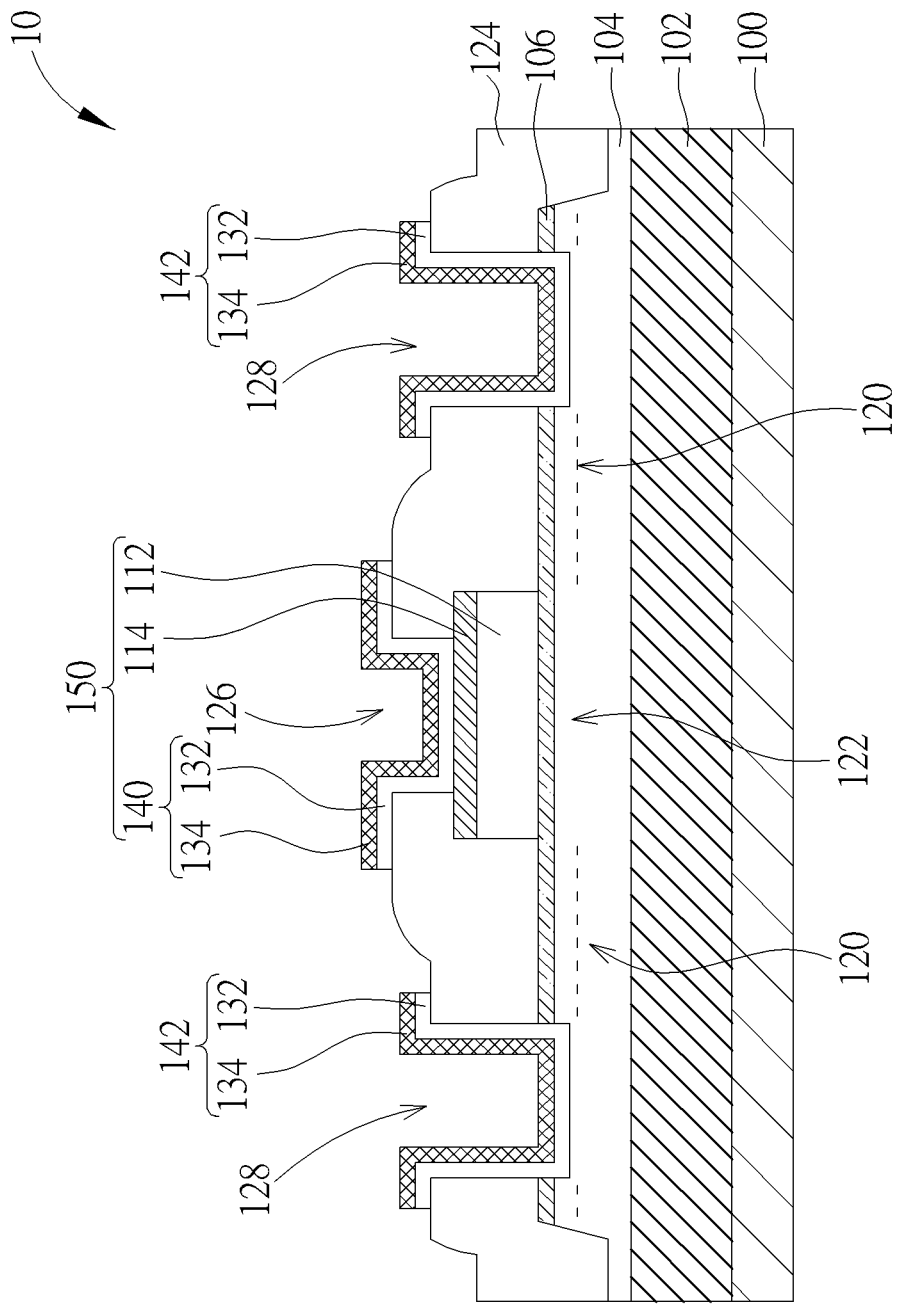
FIG. 8 is a schematic cross-sectional diagram of a HEMT after a gate electrode and a source/drain electrode are formed in contact holes according to one embodiment of the disclosure.

FIG. 8 is a schematic cross-sectional diagram of a HEMT after a gate electrode and a source/drain electrode are formed in contact holes according to one embodiment of the disclosure. The first conductive layer 132 and the second conductive layer 134 may be patterned by performing photolithography and etching processes so as to form the gate electrode 140 and the source/drain electrodes 142 shown in FIG. 8. In addition, the gate electrode 140 may not only be disposed in the gate contact hole 126 but also conformally cover a portion of the top surface of the passivation layer 124. Furthermore, the source/drain electrodes 142 may not only be disposed in the source/drain contact holes 128 but also conformally cover another portion of the top surface of the passivation layer 124.

Then, an interlayer dielectric may be deposited on the passivation layer 124, the gate electrode 140, and the source/drain electrodes 142 so as to obtain the high electron mobility transistor 10 shown in FIG. 1.

Figure 9:
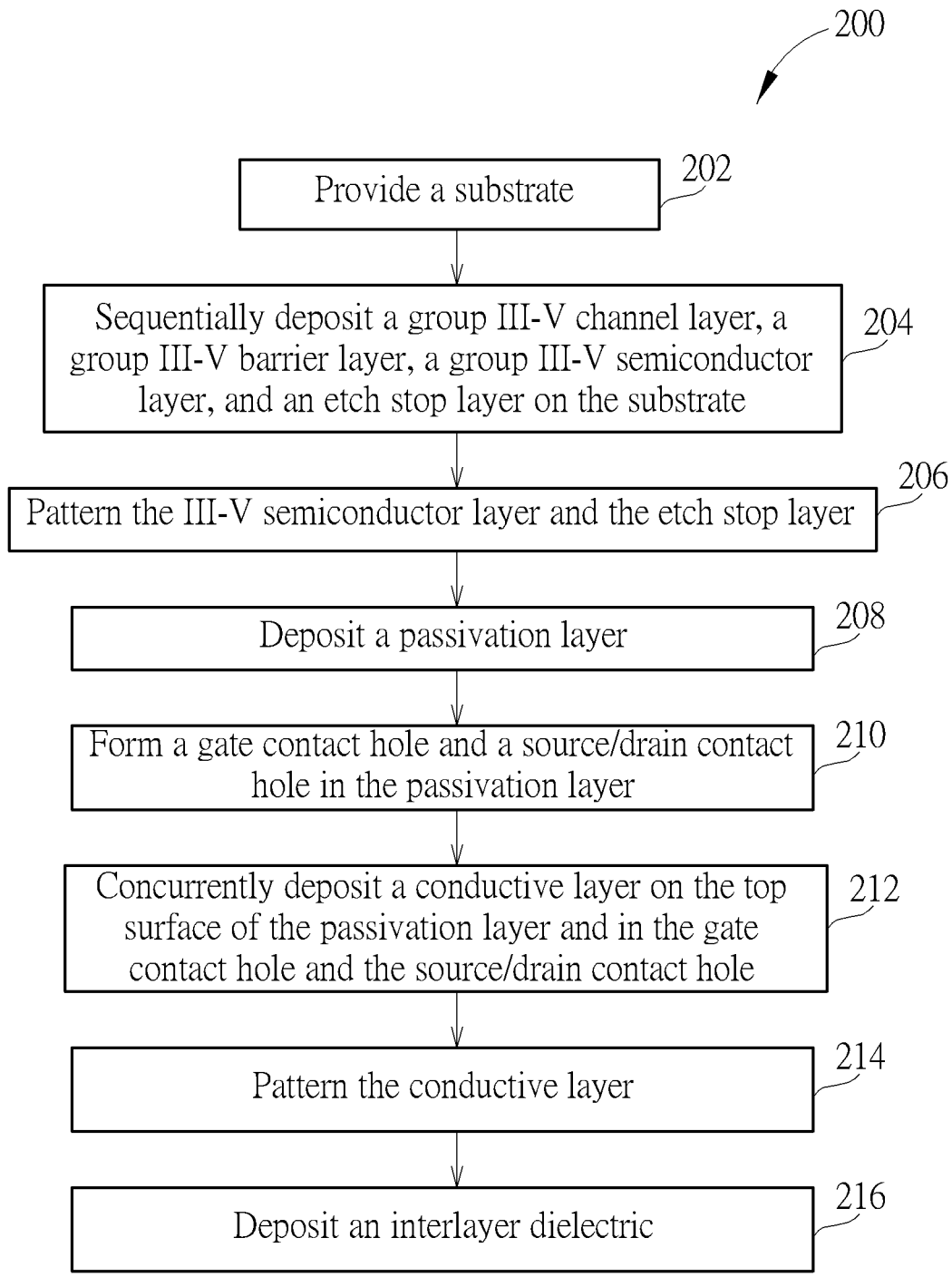
FIG. 9 is a flowchart illustrating a method of fabricating a HEMT according to one embodiment of the present disclosure.

FIG. 9 is a flowchart illustrating a method of fabricating a HEMT according to one embodiment of the present disclosure. Referring to FIG. 9, according to one embodiment of the present disclosure, a method 200 of fabricating a high electron mobility transistor may include the following steps. Step 202: provide a substrate; step 204: sequentially deposit a group III-V channel layer, a group III-V barrier layer, a group III-V semiconductor layer, and an etch stop layer on the substrate; step 206: pattern the III-V semiconductor layer and the etch stop layer; step 208: deposit a passivation layer; step 210: form a gate contact hole and a source/drain contact hole in the passivation layer; step 212: concurrently deposit a conductive layer on the top surface of the passivation layer and in the gate contact hole and the source/drain contact hole; step 214: pattern the conductive layer; and step 216: deposit an interlayer dielectric.

According to the embodiments of the present disclosure, the gate contact hole and the source/drain contact holes may be formed concurrently in the passivation layer by the same photolithography and etching processes. Besides, by properly adjusting the parameters of the etching process, not only may the bottom of the gate contact hole not penetrate the underlying gate etch stop layer, but the source/drain contact holes may not penetrate the underlying group III-V channel layer. Subsequently, the gate electrode and the source/drain electrodes may be fabricated concurrently through the same deposition, photolithography, and etching processes. Therefore, the embodiments of the present disclosure could effectively simplify the complexity and cost of the fabrication process.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method of fabricating a high electron mobility transistor, comprising:
   providing a substrate having a group III-V channel layer, a group III-V barrier layer, a group III-V gate layer, and a gate etch stop layer disposed thereon;
   forming a passivation layer covering the group III-V barrier layer and the gate etch stop layer;
   forming a gate contact hole and at least one source/drain contact hole in the passivation layer, wherein the gate contact hole exposes the gate etch stop layer, and the at least one source/drain contact hole exposes the group III-V channel layer; and forming a conductive layer conformally disposed on a top surface of the passivation layer and in the gate contact hole and the at least one source/drain contact hole.

2. The method of fabricating a high electron mobility transistor of claim 1, wherein the group III-V gate layer is a p-type group III-V gate layer.

3. The method of fabricating a high electron mobility transistor of claim 1, wherein the composition of the gate etch stop layer comprises metal nitride, and a metal element of the metal nitride is selected from the group consisting of refractory metals.

4. The method of fabricating a high electron mobility transistor of claim 1, wherein a composition of the passivation layer comprises silicon oxide, aluminum nitride, aluminum oxide, silicon oxynitride, or silicon nitride.

5. The method of fabricating a high electron mobility transistor of claim 1, wherein a Schottky contact is between the gate etch stop layer and the group III-V gate layer.

6. The method of fabricating a high electron mobility transistor of claim 1, wherein the conductive layer is in direct contact with the gate etch stop layer.

7. The method of fabricating a high electron mobility transistor of claim 1, wherein the at least one source/drain electrode is in direct contact with the group III-V channel layer.

8. The method of fabricating a high electron mobility transistor of claim 1, wherein, after the step of forming the conductive layer, the method further comprises:

etching the conductive layer to form a gate electrode and at least one source/drain electrode.

9. The method of fabricating a high electron mobility transistor of claim 8, wherein, after the step of etching the conductive layer, the method further comprises:

forming an interlayer dielectric to cover the gate electrode and the at least one source/drain electrode.

10. The method of fabricating a high electron mobility transistor of claim 9, wherein the interlayer dielectric is filled into the gate contact hole and the at least one source/drain contact hole and covers the passivation layer.

11. The method of fabricating a high electron mobility transistor of claim 8, wherein, after the step of etching the conductive layer, the gate electrode conformally covers a portion of a top surface of the passivation layer, and the at least one source/drain electrode conformally covers another portion of the top surface of the passivation layer.

* * * * *